US010586675B2

(12) United States Patent
Salou et al.

(10) Patent No.: US 10,586,675 B2
(45) Date of Patent: Mar. 10, 2020

(54) DEVICE FOR MODULATING THE INTENSITY OF A PARTICLE BEAM FROM A CHARGED PARTICLE SOURCE

(71) Applicants: PANTECHNIK, Bayeux (FR); A.D.A.M. SA, Meyrin (CH)

(72) Inventors: Pierre Salou, Monceaux en Bessin (FR); Daniel Fink, Geneva (CH)

(73) Assignees: PANTECHNIK, Bayeux (FR); A.D.A.M. SA, Meyrin (CH)

( * ) Notice: Subject to any disclaimer, the term of this patent is extended or adjusted under 35 U.S.C. 154(b) by 0 days.

(21) Appl. No.: 16/082,352

(22) PCT Filed: Mar. 8, 2017

(86) PCT No.: PCT/FR2017/050510
§ 371 (c)(1),
(2) Date: Sep. 5, 2018

(87) PCT Pub. No.: WO2017/153680
PCT Pub. Date: Sep. 14, 2017

(65) Prior Publication Data
US 2019/0080880 A1    Mar. 14, 2019

(30) Foreign Application Priority Data

Mar. 8, 2016   (FR) ...................... 16 51912

(51) Int. Cl.
*G21K 5/04* (2006.01)
*H05H 7/04* (2006.01)
(Continued)

(52) U.S. Cl.
CPC ............ *H01J 37/147* (2013.01); *G21K 1/087* (2013.01); *G21K 1/093* (2013.01); *G21K 5/04* (2013.01);
(Continued)

(58) Field of Classification Search
CPC ..................... H01J 37/147; H01J 37/04; H01J 2237/31701; G21K 1/087; G21K 1/093;
(Continued)

(56) References Cited

U.S. PATENT DOCUMENTS

| 3,286,123 A | 11/1966 | Goldberg |
| 4,953,192 A | 8/1990 | Plewes |

(Continued)

FOREIGN PATENT DOCUMENTS

| EP | 2592642 A2 | 5/2013 |
| JP | H10302711 A | 11/1998 |

(Continued)

OTHER PUBLICATIONS

International Search Report dated May 30, 2017 for PCT/FR2017/050510.

*Primary Examiner* — Nicole M Ippolito
*Assistant Examiner* — Hanway Chang
(74) *Attorney, Agent, or Firm* — Bachman & LaPointe, P.C.

(57) ABSTRACT

A device for modulating the intensity of a charged particle beam emitted along an axis, comprises 4×N consecutive deflection systems, with N=1 or 2, with the deflection systems being positioned along the axis of said particle beam, and being capable of deflecting the beam relative to the axis in the same direction, with alternating directions of deflection, for two consecutive systems, means for applying a force for deflecting the beam for each deflection system and for varying the applied force; two collimators each having a slot with an opening that increases in width from the center towards the periphery, located respectively between the first and second deflection systems and between the third and fourth deflection systems, with the opening of the slot of the first collimator facing towards one side of the (Continued)

emission axis of the beam, with the opening of the slot of the second collimator facing towards the opposite side of the emission axis of the beam.

13 Claims, 5 Drawing Sheets

(51) Int. Cl.
| | | |
|---|---|---|
| *H05H 7/08* | (2006.01) | |
| *G21K 1/087* | (2006.01) | |
| *G21K 1/093* | (2006.01) | |
| *H01J 37/04* | (2006.01) | |
| *H01J 37/147* | (2006.01) | |

(52) U.S. Cl.
CPC ............... *H01J 37/04* (2013.01); *H05H 7/04* (2013.01); *H05H 7/08* (2013.01); *H01J 2237/31701* (2013.01); *H05H 2007/046* (2013.01); *H05H 2007/085* (2013.01); *H05H 2007/087* (2013.01)

(58) Field of Classification Search
CPC .. G21K 5/04; H05H 7/04; H05H 7/08; H05H 2007/046; H05H 2007/085; H05H 2007/087
USPC ............... 250/396 R, 398, 400, 396 ML
See application file for complete search history.

(56) References Cited

U.S. PATENT DOCUMENTS

| | | | |
|---|---|---|---|
| 8,039,822 | B2 | 10/2011 | Rietzel |
| 8,896,238 | B2 | 11/2014 | Abs |
| 9,111,715 | B2 | 8/2015 | Parker et al. |
| 9,224,569 | B2 | 12/2015 | Schwind et al. |
| 2007/0252089 | A1 | 11/2007 | Gorrell et al. |
| 2008/0211376 | A1 | 9/2008 | Yasuda et al. |
| 2009/0050819 | A1 | 2/2009 | Ma et al. |

FOREIGN PATENT DOCUMENTS

| | | |
|---|---|---|
| JP | 2003132828 A | 5/2003 |
| WO | 2007133225 A2 | 11/2007 |

DEVICE FOR MODULATING THE INTENSITY OF A PARTICLE BEAM FROM A CHARGED PARTICLE SOURCE

BACKGROUND

The invention relates to the technical field of instruments producing charged particles beams in an energy range from 1 eV/charge to several $10^{12}$ eV/q.

Such types of instruments have applications in many fields, depending on the charge, the mass, and the kinetic energy of accelerated particles:
- equipment of the particle accelerators
- ion implantation (surface treatment, etc. . . . )
- medical field (hadron therapy, radioisotope production, nanodrugs . . . )
- vacuum deposition
- micro-etching
- ion propulsion for spacecrafts
- acceleration mass spectrometer for sample analysis, dating.

The invention relates more particularly to the modulation of the intensity (or current or flow of particles) of the charged particle beam produced in order to modulate the impact thereof on the target sample and to be able to vary the possible uses of same instrument.

At present, the charged particle beams can be current modulated in different ways, specifically:
- by varying the intensity of the charged particle source
- by collimating the beam using removable mechanical parts (e.g. slots system, iris)
- by pulsing the beam with various duty cycles.

The various techniques mentioned above, however, raise many technical problems:
- pulsed beams, for instance, cannot be used in all the applications of the charged particle beams,
- the setting of the intensity of the charged particle source and the use of mechanically removable collimators do not meet the reactivity constraints required by some applications.

In the example of the document U.S. Pat. No. 8,896,238, the current of a beam from an ion source generating a curved ion beam within a specific accelerator of the cyclotron type can be modulated. The intensity of the beam is modulated using a Dee electrode connected to a high frequency generator which applies to the Dee electrode an alternating high voltage the amplitude of which can be modulated by a regulator. The ions are accelerated between the Dee electrode and a counter-electrode connected to the ground, through a gap and define, because of the application of voltages of different amplitudes to the Dee electrode, circular paths having different radii. A solid screen spaced apart from the counter-electrode defines with the latter a space for the passage of ions following the trajectory of a curvature exceeding a critical value, and defines an obstacle for the ions the curvature of which is below same critical value. Modulating the amplitude of the voltage applied to the Dee electrode which modifies the various trajectories of the ions, combined with the presence of the screen, makes it possible to modulate the number of ions and thus the current finally emitted by the source.

However, this device is specific to the charged particles having curved trajectories emitted by a source of cyclotron and cannot be applied to a device emitting a linear charged particle beam.

The document U.S. Pat. No. 3,286,123 relates to an apparatus emitting a linear particle beam. In this apparatus, under the effect of a perforated electrode, a deflection system and multiple lenses distributed along the axis of emission thereof, and the presence of a deflector, the charged particle beam is deflected from its original path according to variable profiles depending on the position and focal length of the lenses and some may be collected by a collector placed perpendicularly to the emission axis of the particles. The applications of this device however, are not compatible with those aimed at by the invention, since the charged particle beam is definitely deflected from its original axis and not recoverable at a given fixed location.

Other devices generating linear charged particles beams and provided with modulation means are known but this modulation is performed on the energy of the beam and not on the current (the amount) of particles:
- the document EP 2592642 relates to a device emitting a charged particle beam comprising a succession of octupole elements (302, 304, 306, 308) capable of being the seat of dipole, quadrupole and sextupole excitations, with the first two elements enabling a dispersion in height and energy of the beam, with the two core elements being separated by a collimator provided with a slot-shaped orifice letting a portion of particles having a given energy through, and intercepting the others. This device thus makes it possible to modulate the energy of the charged particle beam, but not the intensity of the exiting beam which remains substantially the same,
- besides, the document U.S. Pat. No. 8,039,822 relates to a charged particle therapy apparatus comprising an accelerator for generating a charged particles beam, with a passive energy modulator comprising an absorbent element and a control unit. The control unit is adapted to switch between an active adjustment of the energy contained in the accelerator and a modulation of the passive energy by the energy modulator, in order to modify the energy of the charged particle beam from a high energy level to a low energy level, stepwise. In particular, this results in shortening downtimes when switching between energy levels but still not the possibility of modulating the intensity of the exiting beam.

The document U.S. Pat. No. 9,224,569 discloses a high brightness ion source with a gas chamber which includes various compartments, each one being provided with a different gas. An electron beam is caused to selectively pass through one of the compartments to provide ions of a certain kind for processing a sample, using deflection plates. It is possible to easily change the species of ions provided by directing the electrons through other compartments containing a different kind of gas in order to process a sample with ions of another kind. If the nature of the ions generated is quickly and easily changed, the number of ion species is reduced to the number of compartments of the gas chamber, and the possible different beam intensities of the various possible ions are also reduced to the number of compartments in the chamber. This system does not allow a continuous change in the intensity of the beam supplied.

So, no satisfactory solution has yet been found for modulating in intensity, continuously, the charged particle beam emitted by a source supplying a linear accelerator.

SUMMARY

The invention aims at solving this problem by providing a device for modulating the intensity of a charged particle beam comprising:

4×N consecutive deflection systems, where N=1 or 2, with the deflection systems being positioned along the axis A0 of said particle beam, and being capable of deflecting the beam relative to the axis A0 in the same direction, with alternating directions of deflection, for two consecutive systems, means for applying a force for deflecting the beam for each deflection system 2 and for varying the applied force two collimators having a slot with an opening that increases in width from the center towards the periphery, located respectively between the first and the second deflection systems and between the third and fourth deflection systems, with the slot of the first collimator being centered along an axis parallel to the deflection axis, with the center axis of the slot of the second collimator being oriented in a direction opposite said first slot; and with the opening of the slot $6_1$ of the first collimator $4_1$ thus facing towards one side of the emission axis of the beam A0, with the opening of the slot $6_2$ of the second collimator $4_1$ facing towards the opposite side of the emission axis of the beam A0 said deflection systems applying on said particle beam an electromagnetic force having an increasing amplitude for the first two and a decreasing one for the last two.

The device according to the invention can also have one and/or another of the following characteristics:

each of said deflection systems is of the electrical or of the magnetic type when the deflection systems are of the electrical type, each system consists of two parallel plates brought to an electric potential and respectively arranged on either side of the emission axis A0, when the deflection systems are of the magnetic type, each of said deflection system consists of a magnetic dipole, the slot of a collimator has a general V-shape with straight or curved opposite edges domed towards the remaining portion of the collimator or towards the empty space defined by such edges, each collimator is placed along the axis so that the slot thereof is positioned on one side of the emission axis A0 while being offset relative to such axis A0 by a distance d, or each collimator is placed along the axis so that the slot thereof is positioned in line with the emission axis A0, when the device comprises 8 deflection systems, four of these systems are so arranged relative to the emission axis as to deflect the emitted beam in a first direction, and four of these systems are so arranged relative to the emission axis as to deflect the emitted beam in a second direction perpendicular to the first one.

The invention relates to a method for deflecting from its emission axis a charged particle beam emitted along an axis A0, using the above device, comprising for 4N consecutive deflection systems, a step of application:

by the first deflection system of a first force for deflecting the beam in a given direction and in a first orientation, by the second deflection system, of a second deflection force greater than the first one, in the same direction and in an orientation opposite the first one, by the third beam deflection system, of the second force for deflecting the beam in the same direction and in the first orientation of deflection, by the fourth deflection system, of the first deflecting force, in the same direction and in an orientation opposite the first one.

Ideally, the deflection systems are of the electrical type, and each comprise two plates parallel to the axis A0 and arranged on either side of such axis A0, with the potentials applied to the two plates of the same system being symmetrical or asymmetrical.

According to another possible embodiment, each deflection system is composed of two plates arranged on either side of the axis (A0), with two or more plates of different deflection systems being grounded, with the forces deflecting the beams of the deflection systems of the plates being different, with correction factors (IBU) being applied to each deflecting force imposed on a deflection system, one plate of which is connected to the ground in order to correct the exit angle of the beam.

According to another characteristic, additional adjustable deflection forces are applied to one or more deflection system(s) in order to correct the exit angle of the beam.

The invention also relates to an assembly for emitting a charged particle beam of adjustable intensity, comprising in succession along an emission axis A0 of the beam:

a source of emission of a charged particle beam centered about an emission axis A0, preferably of the ECR type an extraction system a lens of the Einzel type a collimator having a circular central hole the device for modulating the intensity of the beam of an outlet of the first collimator, a second collimator having a circular central hole a device speed-filtering the particles at the outlet of the second collimator.

BRIEF DESCRIPTION OF THE DRAWINGS

Other data, characteristics and advantages of the present invention will appear upon reading the following non-restrictive description, with reference to the appended figures which represent, respectively.

DETAILED DESCRIPTION

Figure 1:
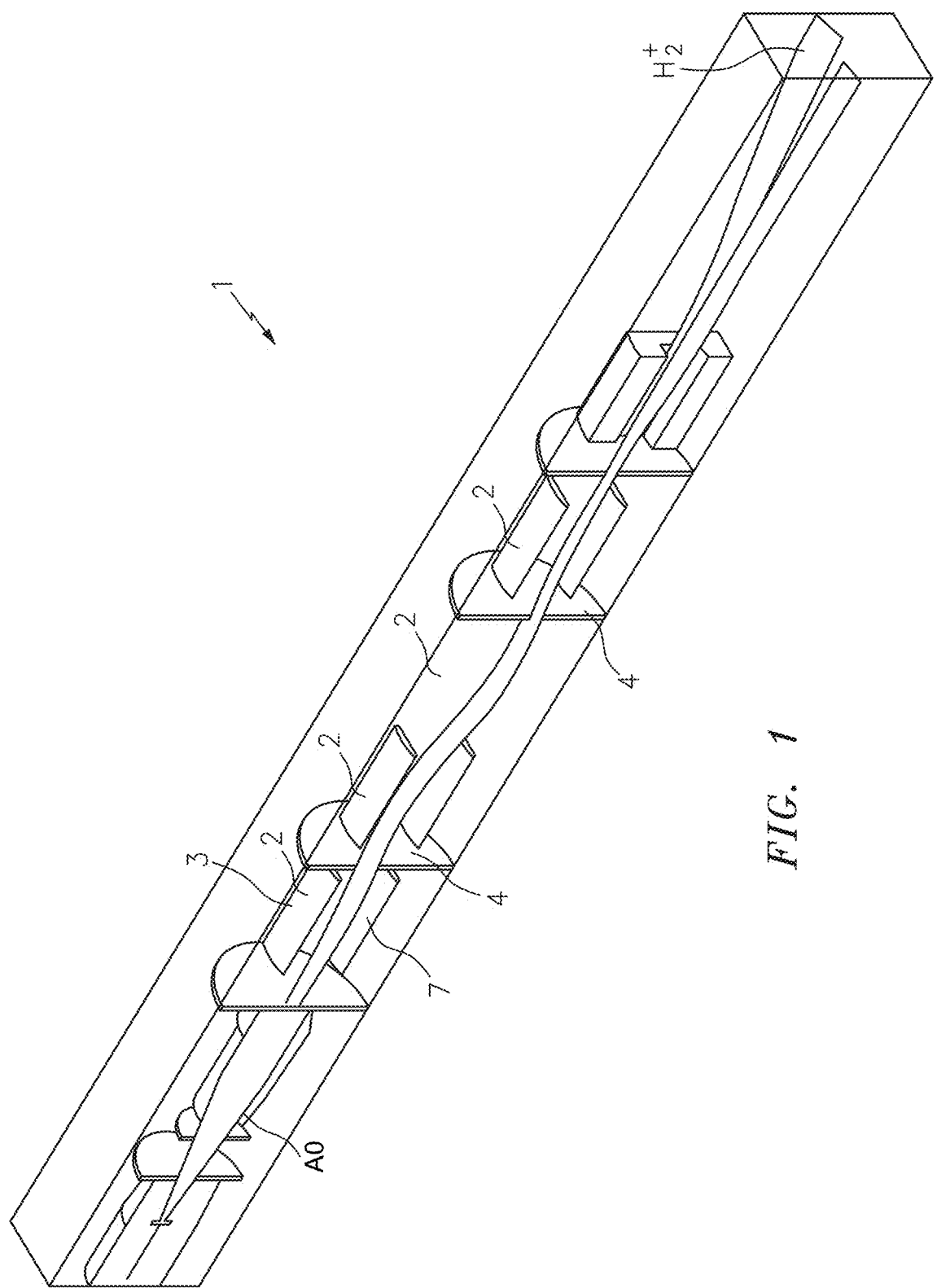
FIG. 1 shows a perspective view of an assembly for emitting a charged particle beam having adjustable intensity provided with an intensity modulation device according to the invention.
Figure 2:
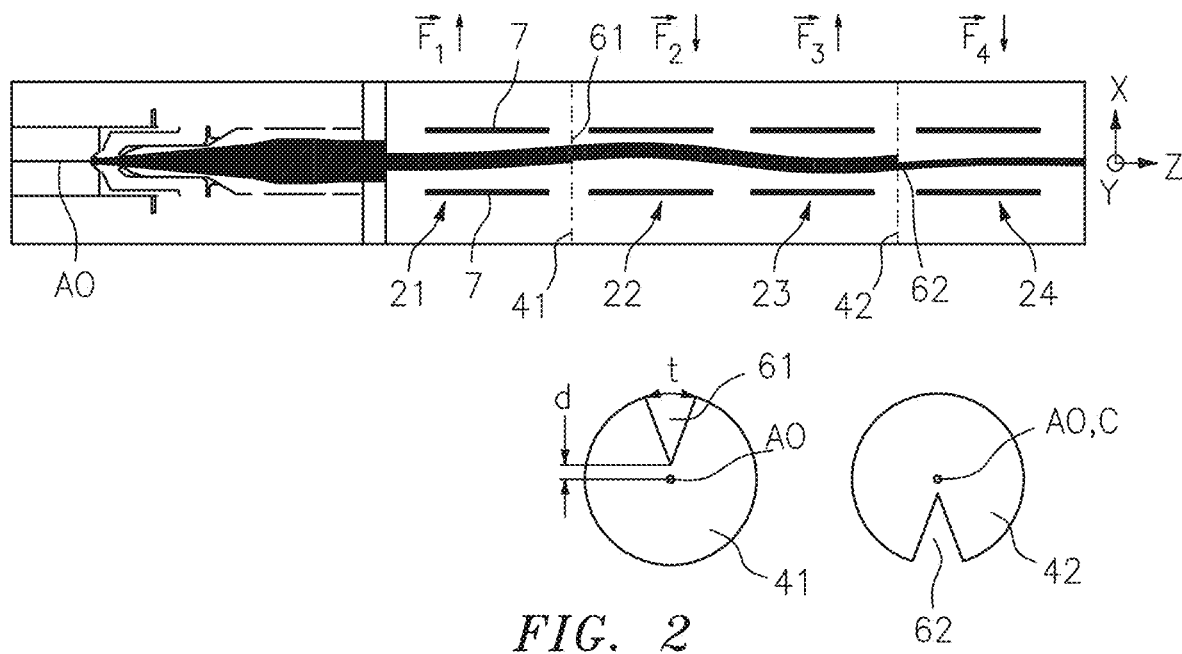
FIG. 2 shows a schematic longitudinal sectional view of the modulation device of FIG. 1, highlighting the V-shaped slot collimators of such device.

According to FIG. 2, the invention relates to a device for modulating the intensity of a particle beam 1.

The device is positioned downstream of a source of particles of the ECR type, an extraction system, a lens of the Einzel type and a collimator with a circular central orifice, 20 mm in diameter in the example illustrated, and upstream of a second collimator having a circular central orifice, and optionally a particles speed-filter so that these are used for various applications.

The assembly of the particle source, the extraction system, the lens and the first collimator outputs a charged particle beam having an intensity I0 along an axis A0.

The device for modulating the intensity of the charged particle beam according to the invention comprises:

- 4×N deflection systems 2, with N=1 (or 2 according to an alternative embodiment, not shown), with the two deflection systems being positioned along the emission axis A0 of said particle beam,
- means 3 for applying a force for deflecting the beam for each deflection system 2 (only one of such means is schematically shown),
- two collimators with a V-shaped slot $4_1$, $4_2$ placed respectively between the first and the second deflection systems and between the third and the fourth deflection systems, each being provided with a slot $6_1$, $6_2$ for the passage of the beam deflected relative to its emission axis, with each slot $6_1$, $6_2$ of the collimator increasing in width from the center towards the periphery, with the slot $6_1$ of the first collimator $4_1$ being placed on one side of the emission axis of the beam A0, with the slot $6_2$ of the second collimator $4_1$ being placed on the other side of the axis of the beam A0, with the openings of the slots being oriented in opposite directions from each other.

In the example illustrated in the figures, the deflection systems of the device according to the invention are of the electrostatic type and each consists of two parallel plates 7 arranged on either side of the emission axis of the beam A0. The plates of the various systems are parallel and equidistant relative to the axis A0. A potential difference Ui is applied between the two plates 7 of the same system (see in particular FIG. 3), which constitutes a deflection force F for the beam, which deflects same from its original trajectory A0 on one side of this axis A0 in the direction X marked in FIG. 3.

Deflection systems of the magnetic type could also be used, which makes the modulation applicable to high energy beams and the applied deflecting force would be of the magnetic type, with such alternative embodiment being schematically illustrated with the same figures as those used for the deflection systems of the electrical type.

In this first example, the deflection forces applied by the first and fourth systems are equal in absolute value (2 U1) and the forces applied by the second and third systems are equal in absolute value (2 U2) in order to place the beam back on the axis A0 at the device outlet.

In addition, the voltages U1 and U2 are, according to this first example, bound by the following equation:

$$3U1=U2.$$

1) When the charged particle beam goes through the first deflection system 21, it is deflected on one side of the axis (the positive side of the axis X of FIG. 2) by the deflecting force F exerted by this first system (U1/−U1).

This deflection brings the beam at the height of the slot $6_1$ of the first collimator $4_1$ which it encounters in its path.

This first collimator 4i has, according to FIG. 2, the shape of a circular plate in the illustrated example, but may of course have other shapes, defining a center C coinciding with the emission axis A0 of the beam when the collimator is mounted perpendicularly to the emission axis A0 of the beam, and provided with a generally V-shaped slot, the point of which is shifted by a distance d above the center C, and so of the emission axis A0 in the direction of the deflecting force.

Depending on the deflecting force F1 applied by the first system $2_1$ to the beam, the latter will be more or less deflected on one side (above) the emission axis A0 and a greater or lesser section of such beam will pass through the slot, with the remainder being intercepted by the plate of the first collimator $4_1$.

2) The portion of the deflected beam exiting the first collimator $4_1$ then opens at the second deflecting system $2_2$ which is the seat of a deflecting force F2 (−U2/U2) in the direction opposite that of the first system, and having a greater amplitude than the latter for deflecting such beam portion on the other side of the emission axis A0 (below).

3) The beam portion on the negative side of the axis X opens at the third deflection system $2_3$ which is the seat of a deflecting force F3 in the direction opposite that of the second system (U2/−U2), and having an equal or equivalent amplitude for deflecting the beam portion towards the other side of the axis X (to the positive side while remaining on the negative side) close to the axis A0.

Such beam portion encounters, at the outlet of the third deflection system $2_3$, the second collimator $4_2$ provided with a V-shaped slot $6_2$ the opening of which is oriented opposite that of the first collimator (i.e. in the illustrated example, towards the negative side of the axis X) to let more or less particles through according to the deflecting forces of the previous systems.

4) The final deflection system $2_4$ is the seat of a deflecting force F4 ((−U1/U1) that brings back the "trimmed" beam through the two slots $6_1$, $6_2$ precisely in the initial emission axis A0. The direction thereof is opposite the force exerted by the previous deflection system with a lesser amplitude.

Figure 3:
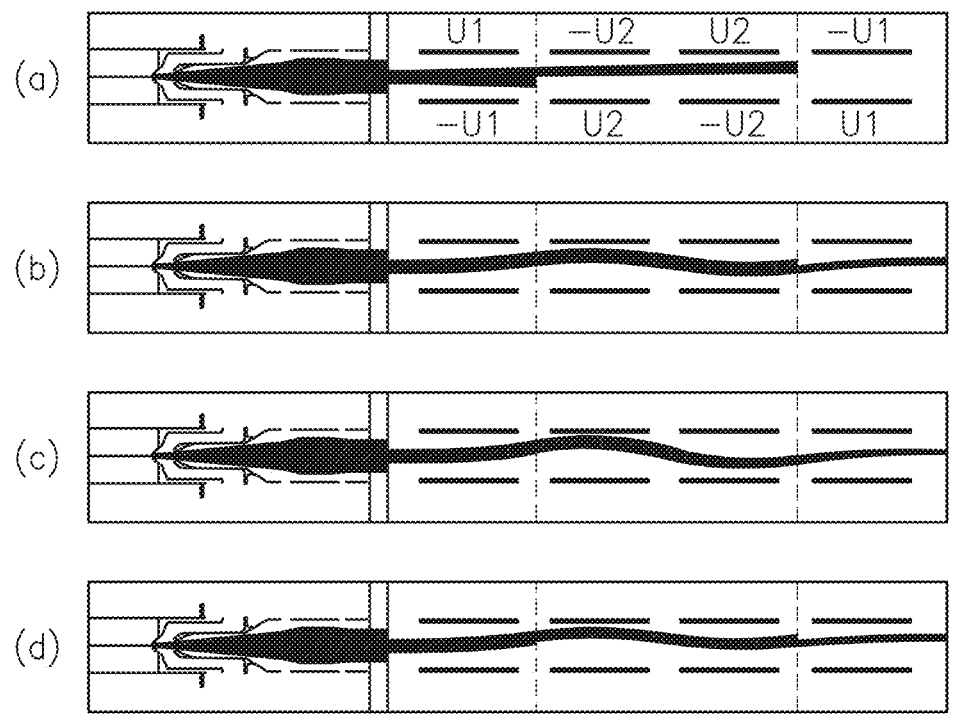
FIG. 3 shows four views similar to those of FIG. 2 for various applied voltages.

According to FIG. 3, the variation in the potentials applied (or applied beam deflecting force) by each of the deflection systems, makes it possible to vary the intensity of the beam at the device outlet:

- in the example of FIG. 3(a), all the particles are stopped because the point of arrival of the beam on each collimator (the beam portion having passed through the first slot $6_1$ does not go through the second slot $6_2$ but is intercepted by the collimator $4_2$ because it reaches the collimator above the second slot)
- in the example of FIG. 3(c), almost all the particles go through the device (substantially all the particles go through the first slot, and almost all the beam portion exiting the first collimator goes through the second slot)
- the examples of FIGS. 3(b) and 3(d) illustrate intermediate situations between the situations 3(a) and 3(c).

Figure 4:
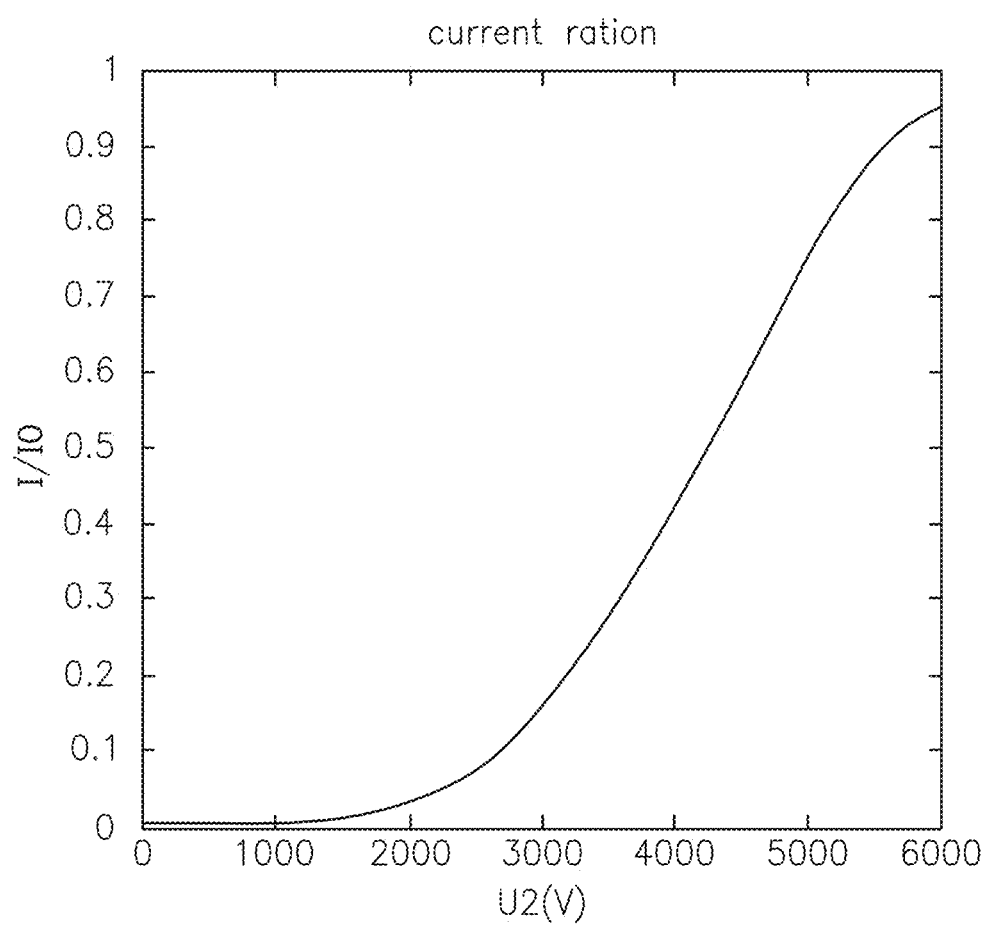
FIG. 4 illustrates in a graph, the evolution in intensity of the beam I of particles at the modulation device outlet relative to the beam intensity at the inlet I0, depending on the voltage U2 applied to the deflection systems.

According to FIG. 4, a variation in the intensity of the charged particle beam between 0 and 96% of the beam emitted by the source can be obtained, at the device outlet, by varying the intensity U2, with in the illustrated example, the proportion 3U1=U2.

Changing the Voltage

According to a second possible embodiment, the deflecting forces applied by the four consecutive deflection systems are distinct two by two: 2U1 for the first system, 2U2 for the second system, 2U3 for the third system and 2U4 for the fourth system, with, for each system, two plates smaller or greater than potentials equal in absolute value and having opposite directions.

For example, voltages U1, U2, U3, U4 can be bound by the following relationships:

$$U1 = \frac{U*U1a}{k} + U1b + D*U$$
$$U2 = -U*U2a + U2b + B*U$$
$$U3 = U*U3a + U3b + B*U$$
$$U4 = \frac{-U*U4a}{k} + U4b + D*U$$

with:
U voltage parameter of the baffle, in Volts,
k dimensionless coefficient, which represents the positive ratio between the voltage applied between the two outer plates $2_1$, $2_4$ and the one applied between two inner plates $2_2$, $2_3$,
U1a, U2a, U3a, U4a, U1b, U2b, U3b, U4b, B, D correction factors, in volts.

With a coefficient k=3 the beam must exit the baffle with no shift or deflection. To this end, U1a, U2a, U2a, U2a are each set equal to 1 and U1b, U2b, U3b, U4b, B, D are set to 0.

The intensity modulation is obtained by partial interception of the beam by the collimators with V-shaped slots as described above. The amplitude of the interception depends on the deflection, itself depending on the voltage of the baffle $2_1$ considered. The correction factors U1a, U2a, U3a, U4a, U1b, U2b, U3b, U4b, B, D are the same for the same voltage parameter U. For example, these correction factors may be set to:

k between 2.5 and 3.5; U1a, U2a, U3a and U4a between 0 and 2; U1b, U2b, U3b and U4b between −1,000V and +1,000V and B, D between 0 and 2.

Changing the Shape of the Slots

The shape of the slots can be changed in order to also change the modulation behavior (for instance by making the modulation more precise for low currents). Thus, the opposite sides of the slots could be straight or not, curves domed towards the solid portion of the collimator or on the contrary domed towards the empty space of the slot. The slot of each collimator is so provided as to be offset relative to the center C to cut the output beam when the deflection systems are not powered.

For example, it may be provided as follows for the slot:
for a greater sensitivity for low intensities
range from 2 μA to 200 μA, with an accuracy of 2%:
interest of having a low deflection of the curve for low intensities, which results in a flared slot profile with an almost radial slope at the center and an opening increasing towards the periphery,
Or closing of the slot towards the periphery for limiting the intensity
Or offset below the center, to ensure a minimum intensity even in the absence of potential applied to the plates.

The modulation device may be coupled to a current measuring system (of the Faraday cage or of the not intersective measurement type) positioned downstream of the last deflection system in order to perform a fine adjustment of the current by a control loop acting on the deflecting force exerted by the deflection systems.

Figure 5:
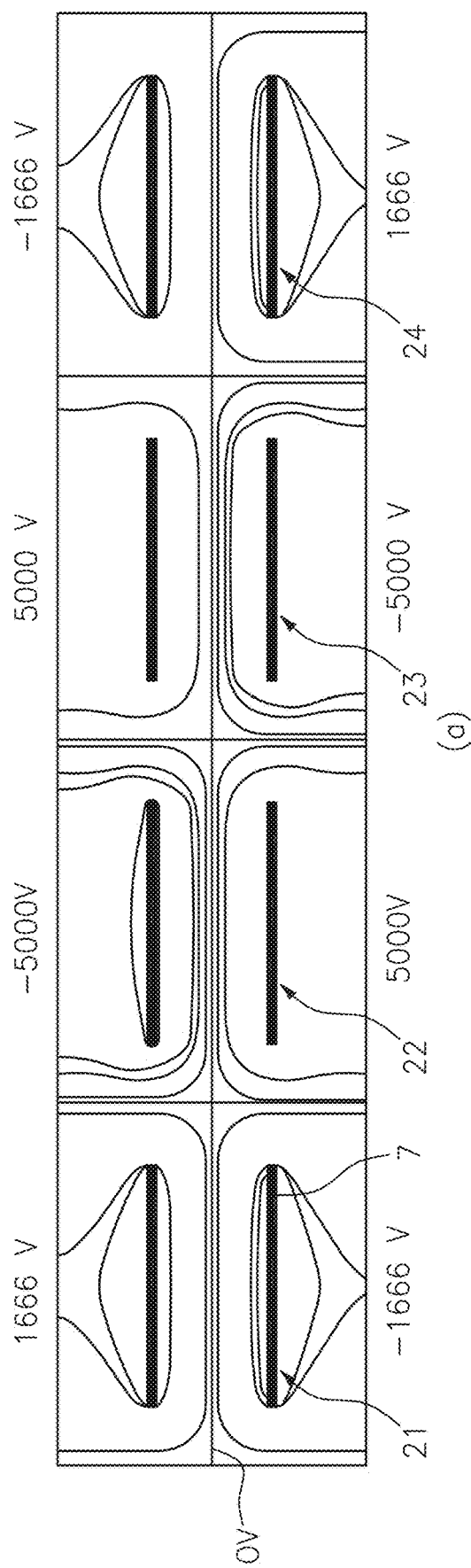
FIG. 5 shows the device of FIG. 2 showing the potential lines applied with symmetrical potentials (5(a)) and asymmetrical potentials (5(b))
Figure 5:
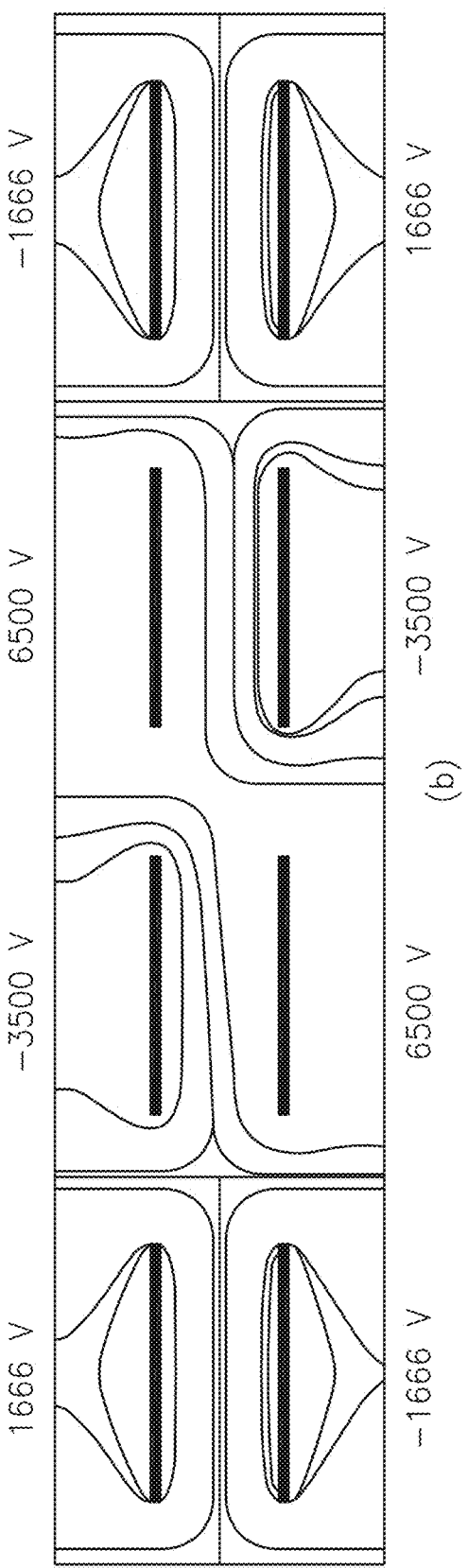
Figure 6:
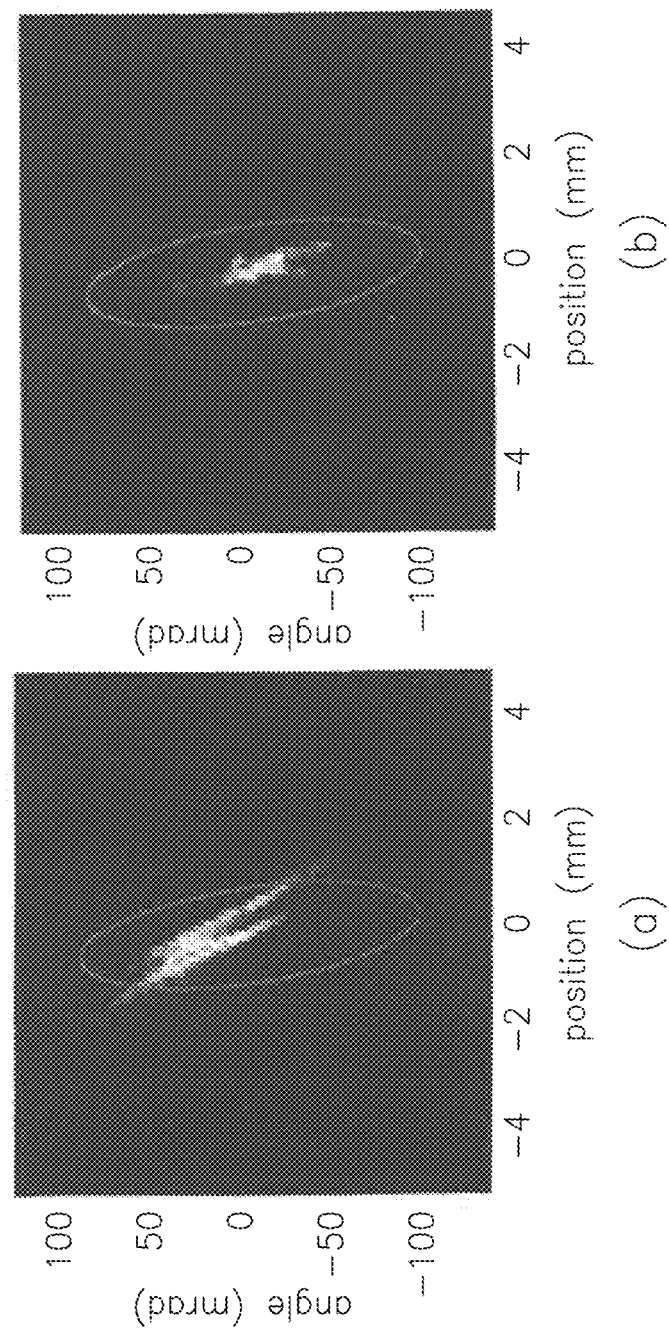
FIG. 6 illustrates the emittance of beams in the case of symmetrical (FIG. 6(a)) and asymmetrical (FIG. 6(b)) potentials, with the ellipse shown corresponding to the acceptance of a particular beam line, and highlighting the fact that it is possible, using potential asymmetry (while keeping forces symmetry) to correct the optical aberrations of the device to make the beam compatible with the rest of a line.

The potentials applied to the deflection plates of the same deflection system can be symmetrical so as to limit the number of power supplies as per FIG. 5(*a*) (collected beam intensity visible in FIG. 6*a*).

Otherwise, using two plates of the same system, non-symmetrical potentials (FIG. 5(*b*) is possible: potentials of the systems 22 and 23, the two plates of which are high in absolute value at 3,500V and 6,500V, respectively), with this enabling better beam properties at the outlet, which then fits entirely within a given region (limitation of the emittance and aberrations, see FIG. 6*b*).

Case of a Deflection of the Incident Beam Relative to the Axis A0

An alternative embodiment is required if there is an angle of incidence on the beam, a misalignment of the mechanical structure, or a field asymmetry, involving that the beam exits the structure of a baffle with an angle α(U) relative to the axis A0. The exit angle α(U) of the beam can be a function of the parameter U of the baffle and thus not constant.

The invention makes it possible to instantaneously correct this deflection angle by breaking the symmetry of the voltage applied to the baffle. This is made possible by grounding two or more plates with different voltages U1, U2, U3, or U4 and by varying the corresponding correction factor U1b, U2b, U3b, and U4b respectively.

In the modified configuration of the baffle, each voltage U1, U2, U3, and U4 must remain applied to at least one plate.

The values of the correction factor may be experimentally determined for each set point of the parameter U of the baffle.

The modulation of intensity by the modified baffle is thus described by I(U, $U_i$b), where $U_i$b are the correction factors with i=1, 2, 3, 4 of the corresponding voltages Ui for which one of the plates has been grounded.

As an alternative embodiment, the exit angle can be corrected by applying additional individual adjustable voltages to one or more plate(s) instead of grounding same.

Formulas for this Embodiment of the Baffle

Grounding one of the plates requires doubling the voltage of the opposite plate to direct the beam through the baffle. The conventional formulas for the baffle may be modified as follows:

U1'=2*U1, If the upper plate $2_4$ or the lower plate $2_4$ is grounded.
U2'=2*U2, If the upper plate $2_3$ or the lower plate $2_2$ is grounded.
U3'=2*U3, If the upper plate $2_2$ or the lower plate $2_3$ is grounded.
U4'=2*U4, If the upper plate $2_1$ or the lower plate $2_4$ is grounded.

One of the possible practical embodiments of the modified baffle would be grounding the upper plates $2_1$ and $2_4$ and doubling the voltages U1 and U4. The direction introduced by the baffle can be corrected by modifying U1b depending on the baffle parameter U:U1b (U). In this case, the modulation of intensity by the modified baffle is defined by I(U, U1b (U)).

For example, for this embodiment and with our specific structure, the following parameters (U1a=2, U2a=1, U3a=1, U4a=2, B=D=0, k=2.7 are constant) have been found for some measured intensities in the range between 1 μA and 300 μA:

| Measured intensity I(U, U1b(U)) (μA) | Baffle voltage, U (V) | Correction factors, U1b (V) |
|---|---|---|
| 296 | 5,000 | 150 |
| 220 | 4,000 | 30 |
| 123 | 3,000 | −125 |
| 46 | 2,000 | −150 |
| 23 | 1,500 | −170 |
| 3 | 1,000 | −220 |

With these values, the center of the beam was found on the beam axis at the position of the measuring plane.

To cover the whole interval without interruption, the relationship U1b(U) between the correction factor and the voltage of the baffle has to be found. Generally, all the relationships Uib(U) have to be found, with i=1, 2, 3, 4.

It should be noted that the parameters of the baffle and the correction factors have no universal values and can be different for other facilities.

Grounding the lower plates gives the same result.

Voltages can also be applied in the reverse order and the direction of the collimators and the sign of the voltages applied can also be reversed. The formulas for the modified baffle remain unchanged.

Case of Eight Deflection Systems

Furthermore, the device according to the invention may comprise an additional set of four deflection systems as described above, which will modulate the intensity of the particles in the direction Y shown schematically in FIG. 2. The plates of such deflection systems will then be perpendicular to those of the first set of deflection systems.

Possible Dimensions of the Device:

80 cm long; 15 cm×10 cm plate; distance of 8 cm between the plates; distance of 3-4 cm between two consecutive plates; side of the slot 4 cm, opening angle 60°

Possible Applications:

Proton therapy, adron therapy: for the controlled irradiation of each voxel of a tumor for example.

More specifically, the invention finds an application in proton therapy, especially using linear accelerators for accelerating proton beams, and using in particular a pulsed proton beam where the invention can be used to modulate or change the intensity of a proton beam for radiotherapy treatment.

Ion implantation: modulation of the dose implanted locally, depending on scanning Spectrometry: avoiding saturating the detector Micro-etching: modulating the local efficacy of the etching during scanning

The invention claimed is:

1. A device for modulating the intensity of a charged particle beam emitted along an axis, comprising:
   4×N consecutive deflection systems, with N=1 or 2, with the deflection systems being positioned along the axis of said particle beam, and being capable of deflecting the beam relative to the axis in the same direction, with alternating directions of deflection, for two consecutive systems,
   means for applying a force for deflecting the beam for each deflection system and for varying the applied force,
   two collimators each having a slot with an opening that increases in width from the center towards the periphery, located respectively between the first and second deflection systems and between the third and fourth deflection systems, with the opening of the slot of the first collimator facing towards one side of the emission axis of the beam, with the opening of the slot of the second collimator facing towards the opposite side of the emission axis of the beam.

2. The device according to claim 1, wherein each of said deflection systems is of the electrical type or of the magnetic type.

3. The device according to claim 2, wherein, when the deflection systems are of the electrical type, each system consists of two parallel plates brought to an electric potential respectively arranged on either side of the emission axis.

4. The device according to claim 2, wherein, when the deflection systems are of the magnetic type, each of said deflection systems consists of a magnetic dipole.

5. The device according to claim 1, wherein the slot of a collimator has a general V-shape with straight or curved opposite edges domed towards the remaining portion of the collimator or towards the empty space defined by such edges.

6. The device according to claim 1, wherein each collimator is placed along the axis so that the slot thereof is positioned on one side of the emission axis while being offset relative to such axis by a distance d.

7. The device according to claim 1, wherein each collimator is placed along the axis so that the slot thereof is positioned in line with the emission axis.

8. The device according to claim 1, wherein, when the device comprises 8 deflection systems, four of said deflection systems are so arranged relative to the emission axis as to deflect the axis in a first direction, and four of the deflection systems are so arranged relative to the emission axis as to deflect the axis in a second direction perpendicular to the first direction.

9. A method for deflecting from its emission axis a charged particle beam emitted along an axis, with the device according to claim 1, wherein the method comprises, for 4N consecutive deflection systems, a step of application:
   by the first deflection system, of a first force for deflecting the beam in a given direction and in a first orientation,
   by the second deflection system, of a second force greater than the first force, for deflecting the beam in the same direction and in an orientation opposite the first orientation,
   by the third beam deflection system, of the second force for deflecting the beam in the same direction and in the first orientation of deflection,
   by the fourth deflection system, of the first deflecting force, in the same direction and in an orientation opposite the first orientation.

10. The method according to claim 9, wherein the deflection systems are of the electrical type, and each said deflection system comprise two plates parallel to the axis and arranged on either side of the axis, with the potentials applied to the two plates of the same system being one of symmetrical or asymmetrical.

11. The method according to claim 10, wherein each deflection system is composed of two plates arranged on either side of the axis, with two or more plates of different deflection systems being grounded, with the forces deflecting the beams of the deflection systems of the plates being different, with correction factors being applied to each deflecting force imposed on a deflection system, one plate of which is connected to the ground in order to correct the exit angle of the beam.

12. The method according to claim 10, wherein additional adjustable deflection forces are applied to one or more deflection system(s) in order to correct the exit angle of the beam.

13. An assembly for emitting a charged particle beam of adjustable intensity, comprising in succession along an emission axis of the beam:
    a source of emission of a charged particle beam centered about an emission axis, preferably of the ECR type
    an extraction system
    a lens of the Einzel type
    a collimator having a circular central hole
    the device according to claim 8,
    a second collimator having a circular central hole, and
    a device speed-filtering the particles at the outlet of the second collimator.

\* \* \* \* \*